United States Patent [19]

Ito

[11] 4,103,193
[45] Jul. 25, 1978

[54] RECTIFIER ASSEMBLY FOR VEHICULAR ALTERNATOR-RECTIFIER

[75] Inventor: Nobuo Ito, Kariya, Japan

[73] Assignee: Robert Bosch GmbH, Stuttgart, Fed. Germany

[21] Appl. No.: 740,510

[22] Filed: Nov. 10, 1976

[30] Foreign Application Priority Data

Nov. 28, 1975 [JP] Japan ............................. 50/161734[U]

[51] Int. Cl.² ............................................. H02K 11/00
[52] U.S. Cl. ..................................................... 310/68 D
[58] Field of Search ................... 310/68 R, 68 D, 71; 321/8 R; 363/13

[56] References Cited

U.S. PATENT DOCUMENTS

| | | | |
|---|---|---|---|
| 3,641,374 | 2/1972 | Sato | 310/68D |
| 3,870,944 | 3/1975 | Ogawa et al. | 310/68 D X |
| 3,895,247 | 7/1975 | Iwata et al. | 310/68 D |
| 3,970,881 | 7/1976 | Sato | 310/68 D |

*Primary Examiner*—Donovan F. Duggan
*Attorney, Agent, or Firm*—Flynn & Frishauf

[57] ABSTRACT

The heat-sink plates on which the rectifier diodes are mounted are fastened to an insulating base member essentially of the shape of an arc of a circle of between 240° and 320°. Opposite the position of each of the diodes, which each have a lead extending alongside but spaced from the insulating member, a connection device with inwardly and outwardly extending lugs is affixed to the insulating base member, the inwardly extending lug being connected to the diode lead and the outwardly extending lug being connected directly (or indirectly through a strapping wire) to a lead of the stator winding of the alternator. This construction enables diode leads to be connected before installation of the rectifier unit in the alternator casing and facilitates soldering the stator winding leads to the assembly. The connectors may be crimped sleeves or bent-up wire devices.

10 Claims, 7 Drawing Figures

RECTIFIER ASSEMBLY FOR VEHICULAR ALTERNATOR-RECTIFIER

This invention relates to a rectifier assembly designed to be built into the three-phase alternator of a motor vehicle in order to constitute therewith a combined alternator-rectifier unit, and particularly a rectifier assembly of the type in which heat-sink plates respectively connected to the positive and negative output terminals of the combined device are provided which each carry half of the usually six or eight diodes of the rectifier.

In the rectifier assemblies of that kind heretofore known, the diodes were soldered or pressed into contact with the heat-sink plates by means of the diode casing itself serving as one electrode or by means of a separate casing and the free electrode lead served as the means for connection to the stator winding of the generator. The provision of a connection between the rectifier diodes and the leads of the stator winding was unusually difficult and required much skill. Since in the heretofore conventional arrangement the free electrode leads of the diodes were brought adjacent to the stator by positioning the heat-sink plates, in order to solder the connections it was necessary first to fix the position of the heat-sink plates with reference to the stator and only then to carry out the soldering operation with a soldering iron or gun from the inner side of the armature. Furthermore, in connecting the stator winding of the generator to the electrode leads of the diodes, forces could unintentionally be made operative on the diodes that could lead with undesirable frequency to the destruction of a diode.

It is an object of the present invention to provide a rectifier assembly with an insulating member of new design that makes it unnecessary to solder the diode leads to the stator winding leads and enables the above-described disadvantages to be overcome.

SUMMARY OF THE INVENTION

Briefly, an insulating base member to which the heat-sink plates are fastened is provided which is substantially of circularly arcuate shape with a circumferential dimension not less than 240° nor more than 320° of arc and and which has a radial dimension, not counting integral collars for mounting purposes, which is not greater than one-quarter of the average radius of the base member. The base member has affixed thereto connecting members distributed circumferentially on the insulating member. Preferably the insulating member has configuration features for localizing the place of affixation of the connection members and each connection member has a connecting lug located inwardly of the insulating member for connection to the free connection lead of a diode mounted nearby in a heat-sink plate and also a connection lug located outwardly of the insulating member for connection to a lead of the stator winding of the alternator.

In one form of the invention, the configuration features of the insulating base member for locating the connection members are portions of reduced cross-section and the connection members are sheet metal bracelet-like devices with a U-shaped lug for the stator winding lead and an L-shaped lug for the diode lead. In another form of the invention, the connection members are made of formed wire and fit into slots of projections of the insulating member that constitute the configuration features for localizing the place of affixation of the connection members.

The heat-sink plates and the insulating member are preferably fastened together by fastening members passing through aligned holes in a plate and in the insulating member and for each plate one of these fastenings also serves as a d.c. terminal. The heads of the screws or rivets for fastening the base to the heat-sink plates may be as large as or larger than the radial dimension of the insulating base member, so that the base member shape may desirably spread out to one side around the corresponding mounting holes to provide a sufficiently wide integral collar for the fastening rivet or screw.

The rectifier assembly of the present invention has advantages of a greater resistance to the effects of vibration, a greater ease of assembly and lower costs compared to the previously known rectifier assemblies of alternator-rectifier units for automotive use.

The preferred features of the rectifier assembly of the present invention have the further advantages that the connection members are readily fastened to the insulating base member and, once fastened, remain firmly in position. Furthermore, the electrode leads of the diodes can be connected to the corresponding connection members of the assembly before the rectifier assembly is inserted into the alternator casing, which is to say before the soldering of the stator winding leads. The positioning of the heat-sink plates on opposite sides of the axis of the assembly (which is normally the axis of the alternator shaft when the device is mounted) is definitively fixed by the fastening of the heat-sink plates on the insulating base member.

By the arrangement of the connection members with lugs extending inwardly and outwardly of the base member in accordance with the invention, the automation of the making of all connections becomes possible. On account of the good quality of fixation of the connection members on the insulating base member, on account of the mechanical balance among connection members for connecting the diode leads and stator winding leads and on account of the short-connection lengths made possible, the rectifier assembly of the present invention is inherently stable and vibration-proof. Of course, the arrangement of the rectifier assembly coaxially adjacent to the stator helps to protect the alternator from the introduction of dirt from the outside, while at the same time effective cooling is provided for, because cooling air and flow by the heat-sink plates directly and undisturbed by the components.

The invention is further described by way of illustrative specific examples with reference to the accompanying drawings, in which.

Figure 1:
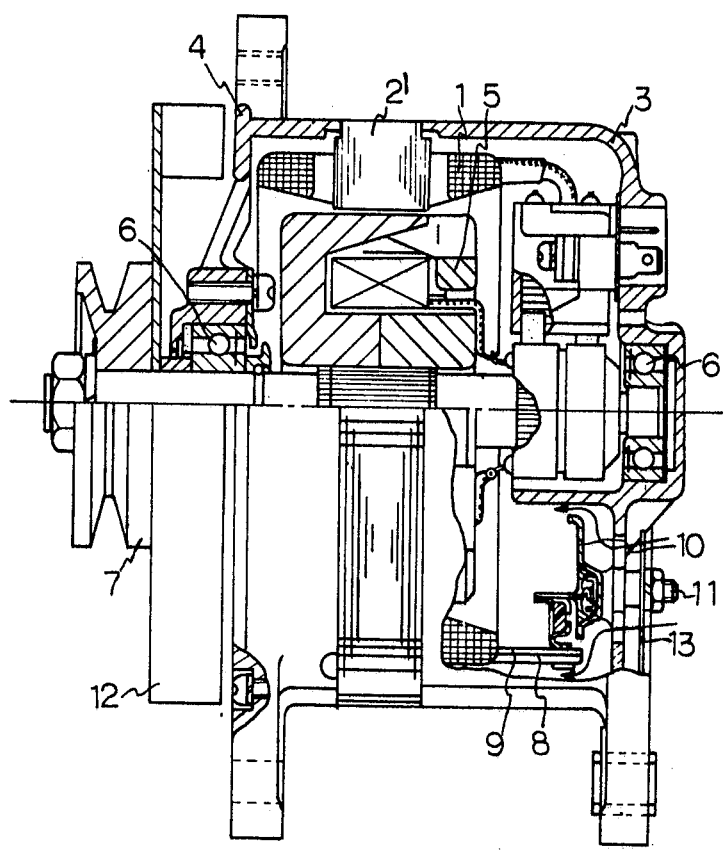
FIG. 1 is a side view, partly in longitudinal section, of a rectifier assembly according to the invention located within the casing of an alternator so as to provide an alternator-rectifier unit.

In the alternator-rectifier unit shown in FIG. 1, a three-phase stator winding 1 is wound on a stator core 2 in a casing at the axial ends 3 and 4 of which bearings 6 for a rotor 5 are provided. The rotor 5 is arranged to be driven by a belt pulley 7 by a vehicle motor that is not shown in the drawing. During operating of the alternator, a voltage is induced in the stator winding 1 and the resulting current is supplied through the winding lead 8 to a rectifier assembly 10, where it is converted into a direct current which can be supplied to an external load from the output terminal 11. The rectifier assembly 10 is cooled by air which a fan 12 sucks through the window 13 of the casing end 3 into the interior of the alternator-rectifier.

The rectifier assembly is shown in detail in FIGS. 2-5. The heat-sink plates 14 and 14' are more or less arcuate in outline and serve both to cool the diodes 16 and to operate as connection busses for them and for external d.c. connections. The heat-sinks 14 and 14' carry the diodes 16 in respective depressions 15 and 15', the polarity being reversed for the diodes carried by one heat-sink with respect to the diodes carried by the other. Thus, for example, the heat-sink 14 serves as the positive d.c. connection and accordingly carries in the depressions 15 the positive side diodes 16. The two heat-sinks 14 and 14' are arranged concentrically on opposite sides of the axis of the alternator shaft when the rectifier assembly is mounted. The diodes 16 are preferably soldered to intermediate upper disk inserts 17 in the depressions 15 and 15' of the respective heat-sinks 14 and 14'. The diodes also have an electrode lead 18 extending from the free side of the diode units. As a protection against accumulation of dirt and fatigue from mechanical forces, the diode units 16 are protected externally, for example, with a silica gel layer 19 and a silicon rubber layer 20.

As is well known, at least six diodes are necessary to provide rectification of the output of a three-phase alternator and preferably another pair of diodes with a connection to a starpoint of the three-phase winding is also desirable. Hence, in cases illustrated in FIG. 2, and likewise in FIG. 6 described below, eight diodes 16 are shown and these are connected more or less indirectly with four leads 8 of the stator winding. The leads 8 are shown connected to "strapping" wires 9 so that each may be connected to two diodes 16, so as to constitute a well-known form of diode rectifier bridge circuit.

In the illustrated examples, as shown at the bottom of FIG. 1, the strapping wire 9 is wound into a suitable slot of the stator so that it will be firmly held in place.

The rectifier assembly according to the invention utilizes connection devices 24 having lugs for securing the connection leads to be interconnected. Each of these connection devices 24 has on its radially outward side a U-shaped connection lug 24a. One end of the strapping wire 9, together with one of the external leads 8 of the stator winding 1, is electrically connected with the U-shaped external lug 24a of each of four of the eight connection devices 24, for example by soldering or welding. The other ends of the strapping wires 9 are similarly connected to the external lugs 24a of the other respective connection devices 24. On their radially inward sides the connection devices 24 have connection lugs 24b on top so as to provide an L-shaped configuration and the free electrode leads 18 of the diode 16 are soldered to these lugs. The individual connection devices 24 are fastened, for example by crimping, to an insulating mounting-base member 21 of substantially arcuate shape, the circular arcs defining essentially its shape being concentric with the point through which the axis of the alternator shaft is intended to pass. Thus, the connection members are mounted more or less radially and distributed circumferentially on the insulating base member 21, which is preferably made of an injection-molded or pressure-molded material having a low coefficient of heat transfer. The arcuate insulating member 21 is securely fastened by rivets 22 and screws 23 with the heat-sink plates 14 and 14' that are carried by the insulating base member 21, as shown in FIG. 1, on its side which is opposite to that which faces the stator of the alternator when the rectifier assembly is mounted. Each of the heat-sink plates 14 and 14' is made in one piece so that by the fastening to the insulating base member 21 just described, mutually opposite positions are fixed. The semiconductor diodes 16, as shown in FIG. 1, are mounted on the side of the heat-sink plates 14 and 14' which faces the stator 2 in the mounted position of the assembly, so that the diodes are thus protected from external dirt and do not interfere with the flow of cooling air.

The connection devices 24, as shown in FIGS. 2-5, are bent up from sheet metal and are crimped around the base member body 21 in bracelet fashion, preferably about portions of reduced cross-section of the base member 21 which define the proper position for the connecting members.

Figure 6:
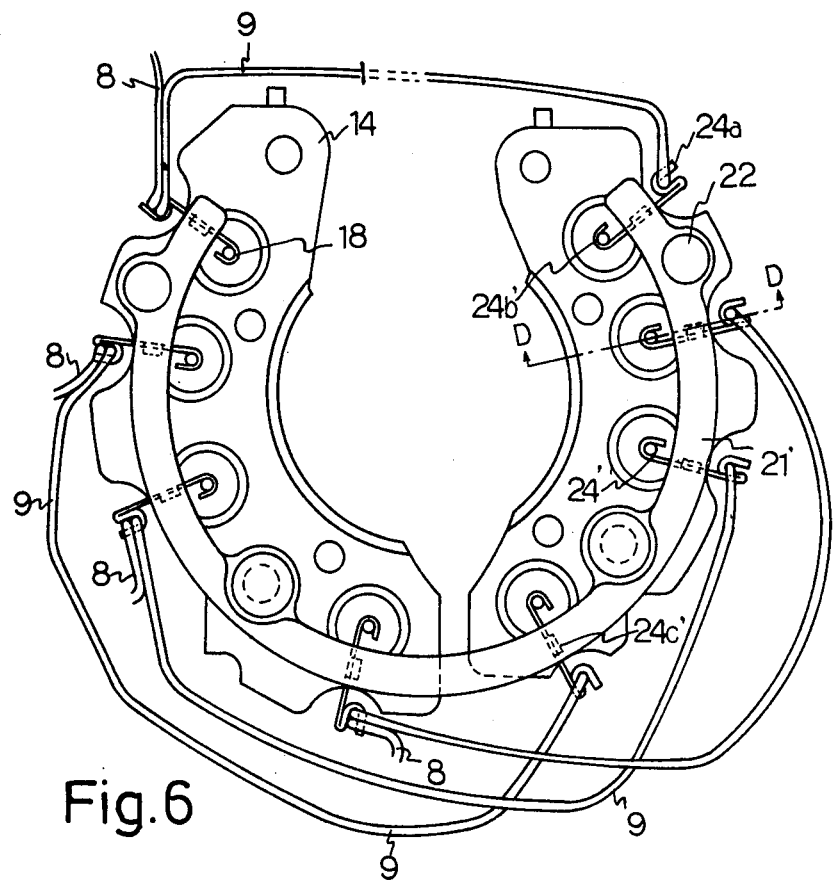
FIG. 6 is a front view of a second illustrative embodiment of a rectifier assembly according to the invention, as seen in a direction parallel to its axis.
Figure 7:
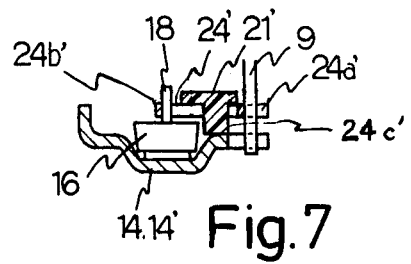
FIG. 7 is a cross-section along the line D—D of FIG. 6.

FIGS. 6 and 7 show a second illustrative embodiment of the invention. In this case the connection devices 24' are made of bent up wire rather than of sheet metal and the connection lugs 24a' and 24b' are made by bending the wire ends as shown in these figures. Here again the insulating base member 21' has configuration features to fix the position of the connecting lugs. Here the wire body of each connection device passes through a slot in a projection 24c' of the insulating body 21', which projection at the same time serves to abut on a heat-sink plate 14 or 14' for maintaining the relative position of the heat-sink plate and insulating body.

Figure 2:
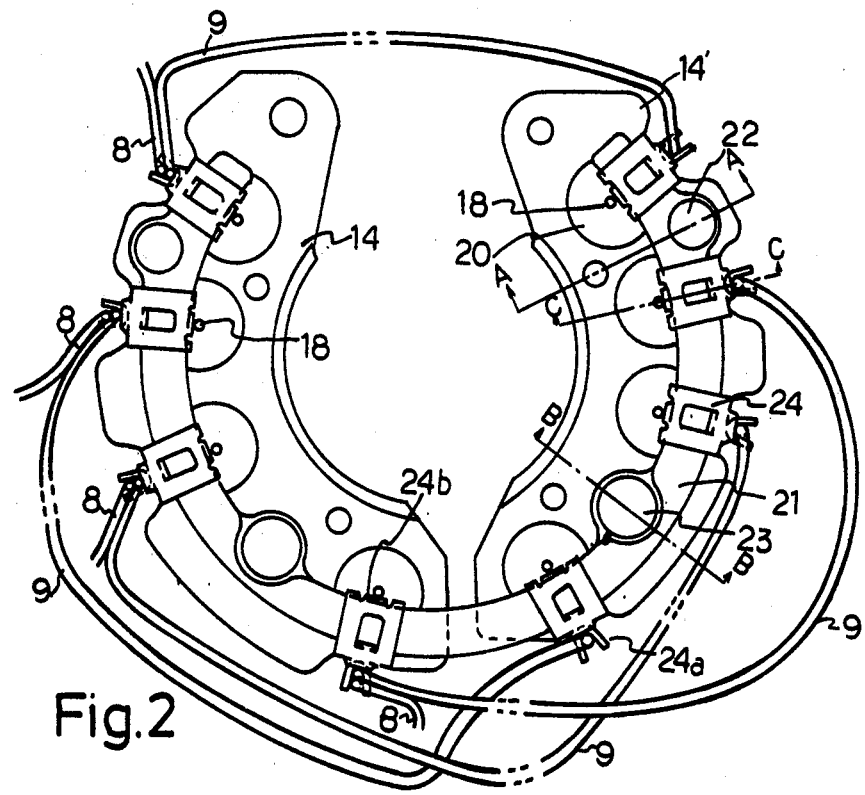
FIG. 2 is a front view of a rectifier assembly according to the invention, seen in a direction parallel to the axis of the assembly (and of the alternator when the assembly is mounted)
Figure 3:
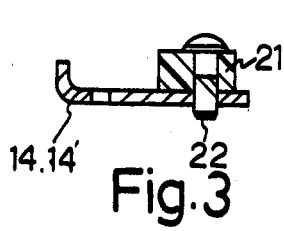
FIG. 3 is a cross-section along the line A—A of FIG. 2.
Figure 4:
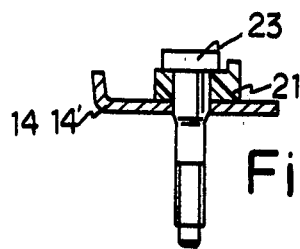
FIG. 4 is a cross-section along the line B—B of FIG. 2.
Figure 5:
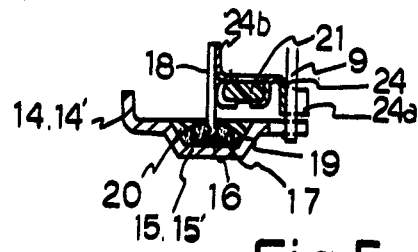
FIG. 5 is a cross-section along the line C—C of FIG. 2.

In both FIG. 1 and FIG. 6, the fasteners 22 and 23 pass through holes that are offset respectively radially outward and radially inward in the body of the insulating member 21 and that body accordingly has bulges so as to provide a collar for the fastener somewhat wider than the cap member of the fastener, the outline of which is visible in FIGS. 2 and 6. Except for these bulges for the provision of these integral collars and for the configuration features for determining the position of the connection devices, the shape of the insulating body 21,21' is strictly arcuate in the illustrated example. The configuration of this insulating body in substantially the shape of a circular arc is important for economically providing the strength necessary for mounting the relative position of the heat-sinks and firmly mounting the connector devices. In the illustrated example, the segment of circular arc constituted by the insulating body 21,21' is about 265°. It should not be shorter than about 240° in order to provide favorable distribution of the connection devices and hence of the diodes around the axis of the machine and, of course, the arc must not so closely approach a full circle that difficulty will be experienced in accommodating the brushholder and brushes shown in the upper righthand portion of FIG. 1, which means that the length of arc should not exceed 320°. Furthermore, cooling is improved by keeping the radial dimension of the insulating body 21,21' relatively short (narrow) and the necessary strength can be provided by the combination of the thickness and the width of the body, as well as the toughness of the material. In practice, therefore, it is preferred to keep the radial dimension of the body, not counting bulges provided for the collars of the fasteners 22 and 23, below 25% of the average radius of the body measured from the center of its arcuate shape.

Although the invention has been described with reference to particular illustrative embodiments, it will be readily recognized that variations are possible within the inventive concept.

I claim:

1. A rectifier assembly for mounting in a three-phase alternator of a motor vehicle to form an alternator-rectifier unit and comprising at least six diodes and also:
    an insulating mounting-base member (21) substantially in circularly arcuate shape with a circumferential dimension not less than 240° nor more than 320° of arc about an axis and with a radial dimension, not counting integral collars provided for assembly purposes, not greater than 25% of its average radius;
    two heat-sink plates (14,14') fastened to said mounting-base member (21) substantially on opposite sides of said axis, insulated from each other thereby and serving as connecting busses having means for connection to the d.c. output terminals of said alternator-rectifier unit, said heat-sink plates and mounting-base member being mechanically mountable on said connection means;
    at least six diodes, each mounted on one of said heat-sink plates with one electrode of said diode connected to the heat-sink plate and each having an axial connection lead for its other electrode extending away from said diode, said diodes being mounted in radially off set relation to said base-member so that their respective axial leads are parallel to each other and, because of said off set relation, pass by rather than through said insullating member;
    a multiplicity of circuit connection members (24) running at least in part radially with respect to said axis and having lugs for connection of connecting leads thereto, said connection members being distributed circumferentially on and affixed to said mounting-base member and said lugs including lugs respectively for connection to a lead of each of said diodes and lugs for connection to at least three leads of a stator winding of said alternator, the lugs for connection to said stator winding leads being provided on said connection member at a radial distance from said axis different from the radial distance of said lugs for connection to said diode leads.

2. A rectifier assembly as defined in claim 1, in which said mounting-base member is provided with configuration features for localizing the affixation position of said circuit connection members (4); in which, further, each of said connection members (24) has a connection lug radially inward of said mounting-base member (21) and a connection lug radially outward from said mounting-base member (21).

3. A rectifier assembly as defined in claim 2, in which said connection lugs radially inward of said mounting-base member (21) have an L-shaped profile (24b) in a plane passing through said axis and serve as connections to a lead of one of said diodes (16), and in which further, said diodes are mounted in said heat-sink members at positions bringing a lead of the diode in each case into a position providing for a short-path connection to one of said lugs located inwardly of said insulating member.

4. A rectifier assembly as defined in claim 2, in which said connection lugs located radially outward of said insulating member are of U-shaped (24a) for providing a connection in each case to one of said leads (8) of said stator winding of said alternator either indirectly through a strapping wire (9) or directly.

5. A rectifier assembly as defined in claim 1, in which said heat-sink plates (14,14') are fastened to said mounting-base member (21) each by means of a plurality of fastening elements passing through coaxial apertures respectively of a heat-sink plate and of said mounting-base member, and in which one of said fastening members of each heat-sink constitutes a terminal of said means for connection to the d.c. output terminals of said alternator-rectifier unit.

6. A rectifier assembly as defined in claim 2, in which said connection members (24) are of sheet metal and have a bracelet-like fastening engagement about said insulating member.

7. A rectifier assembly as defined in claim 6, in which said configuration features of said insulating member are portions of reduced cross-section and in which said insulating members have a bracelet-like fastening engagement around said portions of reduced cross-section.

8. A rectifier assembly as defined in claim 1, in which said connection members (24') are constituted of firm wire.

9. A rectifier assembly as defined in claim 8, in which said configuration features (24c') of said insulating member (21') are projections extending from the remainder of said base member in a directional parallel to said axis and are each provided with a slot for holding in position one of said connecting members (24').

10. A rectifier assembly as defined in claim 5 in which said heat-sink plates (14,14') are fastened to and assembled with said mounting-base member (21) in such a manner to be spaced from the bulk of said mounting-base member (21).

* * * * *

UNITED STATES PATENT AND TRADEMARK OFFICE
CERTIFICATE OF CORRECTION

PATENT NO. : 4,103,193

DATED : July 25, 1978

INVENTOR(S) : NOBUO ITO

It is certified that error appears in the above-identified patent and that said Letters Patent are hereby corrected as shown below:

In claim 4 (column 6, line 22), "shaped" should be --shape--.

In claim 9 (column 6, line 51), "directional" should be --direction--.

Signed and Sealed this

Third Day of July 1979

[SEAL]

Attest:

LUTRELLE F. PARKER

Attesting Officer     Acting Commissioner of Patents and Trademarks